United States Patent [19]
Wu

[11] 3,953,264
[45] Apr. 27, 1976

[54] INTEGRATED HEATER ELEMENT ARRAY AND FABRICATION METHOD

[75] Inventor: Leon L. Wu, Hopewell Junction, N.Y.

[73] Assignee: International Business Machines Corporation, Armonk, N.Y.

[22] Filed: Aug. 29, 1974

[21] Appl. No.: 501,567

[52] U.S. Cl. .......... 156/7; 29/580; 156/17; 219/216; 357/14; 148/187

[51] Int. Cl.$^2$ .......... H01L 21/22; H01L 21/306

[58] Field of Search .......... 219/216, 543; 346/76; 357/45, 56, 14; 156/3, 6, 8, 17, 7; 148/187; 29/626, 580

[56] References Cited

UNITED STATES PATENTS

| | | | |
|---|---|---|---|
| 3,447,235 | 6/1969 | Rosvold et al. | 29/580 |
| 3,466,510 | 9/1969 | Maute | 29/580 |
| 3,559,283 | 2/1971 | Kravitz | 156/17 |
| 3,574,008 | 4/1971 | Rice | 357/14 |
| 3,632,970 | 1/1972 | Walkow | 219/216 |
| 3,689,357 | 9/1972 | Jordan | 156/8 |
| 3,728,179 | 4/1973 | Davidson et al. | 156/8 |
| 3,844,858 | 10/1974 | Bean | 156/8 |
| 3,892,033 | 7/1975 | Kooi | 156/7 |
| 3,911,559 | 10/1975 | Bean et al. | 29/580 |

*Primary Examiner*—William A. Powell
*Assistant Examiner*—Jerome W. Massie
*Attorney, Agent, or Firm*—Thomas F. Galvin

[57] ABSTRACT

A thermal display heater elements array for a comprising an array of semiconductor heater mesas having a larger cross-sectional area at the display surface than at the support surface. The preferred structure is in the shape of a truncated, inverted pyramid. The novel method includes forming the inverted heater elements by etching trenches in one surface of the semiconductor substrate and forming the heater mesas at the opposite surface, with the trenches defining the individual mesas.

11 Claims, 13 Drawing Figures

INTEGRATED HEATER ELEMENT ARRAY AND FABRICATION METHOD

FIELD OF THE INVENTION

The present invention relates to thermal displays having an integrated semiconductor array of heater elements and associated driver and control circuitry.

DESCRIPTION OF THE PRIOR ART

Printing heads comprising integrated semiconductor arrays of heater elements in the shape of mesas have been found to have significant advantages over other types of printing elements. Each heater element of the array comprises a monocrystalline semiconductor body generally having a mesa shape. When the heater element is energized, a "hot spot" is formed at the top surface of the mesa. When thermally sensitive material is passed adjacent the hot spot, a localized dot is produced on the material. A group of selectively energized heater elements forms a group of dots on the thermally sensitive material, thereby defining a character or other information representation on the material.

The geometrical configuration of the mesas has varied, although by far the most common configuration is that of a rectangular prism. One common shape, particularly when the mesas are fabricated from semiconductor material, is that having a surface area which is smaller at the upper surface than at the base. This shape wastes space at the upper surface and lowers the desired resolution of the information which is produced by the thermal printing process.

In addition, prior art approaches to integrated semiconductor arrays of heater elements have attempted to fabricate the switching circuits integrally with the heating element circuitry in the substrate to reduce external electrical interconnections.

One such technique which has been successful is described in U.S. Pat. No. 3,813,513 in the names of Vora and Wu which is assigned to the same assignee as the present application. That patent features a novel heating element having the necessary drive and character generating circuitry in the same semiconductor substrate by conventional integrated circuit techniques using photolithographic, etching, metallization and diffusion operations. The active and passive components of the thermal display are fabricated within the semiconductor substrate comprised of coplanar layers of opposite conductivity type which are disposed in contiguous relationship to form a PN junction between them. The active components of heating circuitry are preferably formed in one of the layers in a pattern which employs the other layer as a heating resistor in a manner substantially restraining current flow and corresponding heating within the mesas. The heating circuitry comprises a transistor formed in a discrete portion of the epitaxial layer which is electrically isolated within the layer by annular circumscribing diffused barrier zone. The bilayered construction allows the integration of driving and character generating circuitry concurrently with the heating circuitry in a common semiconductor substrate. In certain instances, however, this design can result in thermal runaway because the active device which controls the heating is integral with the heater element.

SUMMARY OF THE INVENTION

It is therefore an object of my invention to improve the structure of the semiconductor heater elements for thermal printing and display assemblies.

Another object of my invention is to provide an economic fabrication technique for such elements.

A further object of my invention is to improve the operation of said semiconductor heater assemblies.

Still another object of my invention is to solve the problem of thermal runaway in semiconductor heater assemblies in which active semiconductors devices are associated with the heater elements.

I have found that a mesa in the shape of an inverted, truncated pyramid possesses certain advantages over the prior art mesas already discussed.

Moreover, I have invented a process by which such uniquely shaped mesas can be fabricated. The fabrication process comprises etching trenches in a first major surface of a semiconductor substrate. The nature of the semiconductor material results in trenches having a larger area at the surface than at the bottom of the trench. A portion of the major surface of the substrate opposite the first major surface is removed so as to expose the bottom of the trenches. The semiconductor material at the second major surface defining the trenches is thereby in the desired shape.

Trenches having the sharpest corners are formed in silicon having a (100) crystallographic orientation and when the boundary of the mesa is aligned during processing in the <012> or <021> crystallographic directions. The side surface of the resulting mesa is then aligned in the (121) crystallographic orientation.

In another preferred step of my process I fill the trenches with material to provide mechanical support during the fabrication process. Preferably the material is polycrystalline silicon because of its close match with monocrystalline silicon with respect to thermal expansion properties. At the end of the process the polycrystalline silicon is replaced by a thermal insulating material such as epoxy.

The heater switching circuits are preferably made in an epitaxial layer isolated from the heater mesas to afford stability at high operating temperatures.

These and other features and advantages of my invention may be best understood by reference to the following detailed description when read in conjunction with the accompanying drawings.

DESCRIPTION OF THE PREFERRED EMBODIMENT

Figure 1:
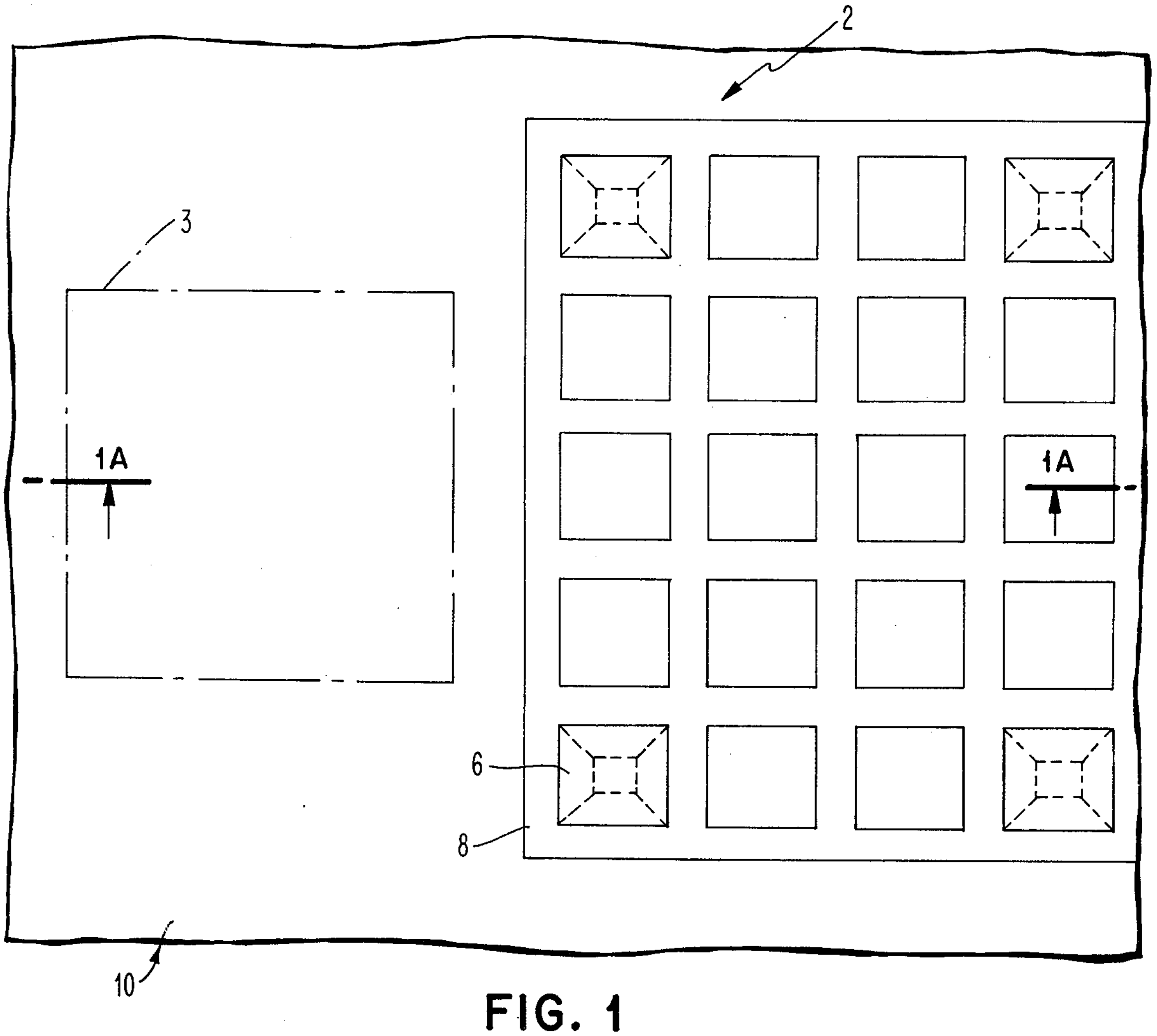
FIG. 1 is a surface view of an integrated semiconductor heater element array and drive matrix.
Figure 1A:
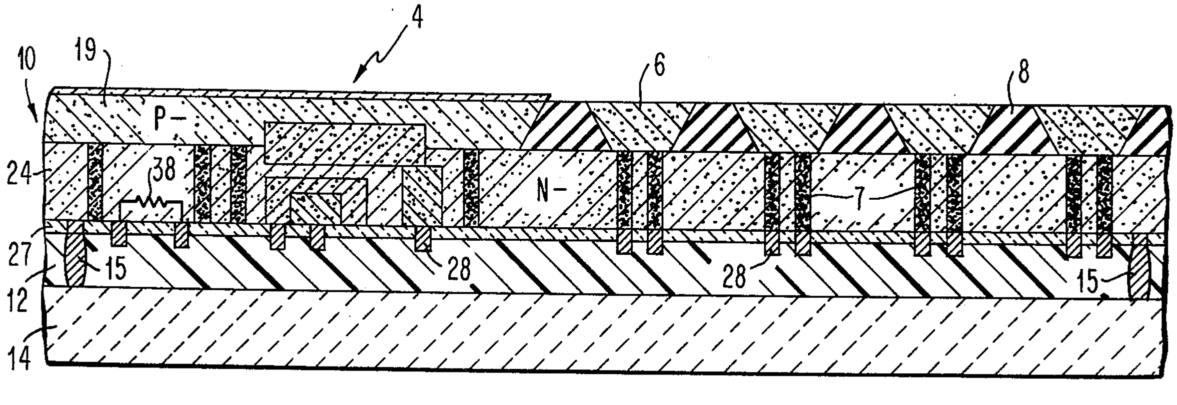
FIG. 1A is a sectional view taken along line 1A in FIG. 1.

FIGS. 1 and 1A illustrate a 4 × 5 heater element array of semiconductor mesas 6 having a novel structure. Each mesa is separated from the adjacent mesas by insulating material 8, which is preferably epoxy. It will be recognized that other insulating material may be used. In addition, the mesas may be air-isolated. The region 3 shown in outline form on substrate 14 contains circuit elements, termed heater switching transistors, which cause the individual heating elements to conduct.

The control and drive circuits as well as the memory circuits which form a complete printing device are not shown. These have been described in great detail in the aforementioned U.S. Pat. No. 3,813,513 and form no part of the present invention. The significant and inventive differences between that patent and other prior art and my present invention reside in: the shape of the heating element, the method for its fabrication, and the placement of the heater switching transistor and an added resistor outside the heating element. Thus, those steps which are detailed in the aforementioned patent and which are obviously applicable to the present system are discussed only cursorily in this specification.

As shown in FIG. 1A, semiconductor substrate 10 is mounted above and connected to a ceramic substrate 14 by means of conductive pads 15. The pads form the electrical interconnection between circuits within substrate 10 and conductive lands on ceramic 14 (not shown) for interconnection between various system elements. An epoxy adhesive 12 mechanically joins wafer 10 and ceramic substrate 14. Each heater element 6 is connected via heavily doped diffusion regions 7 to electrodes 28 for connection to the heater transistors. Electrodes 28 are preferably aluminum conductors. In general, each mesa 6 forms the equivalent of a resistor. The pair of electrodes 7 form the terminals of the resistor, one terminal for connection to a source of potential, the other terminal for connection to the collector of the heater transistor 4 associated with one of the heating mesas 6.

One novel aspect in the structure illustrated in FIGS. 1 and 1A is the geometrical configuration of mesas 6. The surface area of the face of the mesas opposite semiconductor layer 24, i.e., the printing face, is larger than the area contacting layer 24. Prior art structures such as that shown in U.S. Pat. No. 3,813,513 are substantially in the form of a truncated pyramid in which the upper surfaces have an area which is less than that of surfaces contacting the substrate. One aspect of my invention, on the other hand, contemplates a structure which is an inverted pyramid and the process for making this unique structure. Some advantages of my invention are that the heating surface is increased because of the inverted shape, and the spacing between mesas can be reduced substantially over that of conventional structures. For example, with the techniques which I will describe in succeeding sections of this specification, the spacing at the printing surface can be reduced to about one mil, using present technology, as compared to the five to seven mils for the conventional structure. Thus, the new structure has a better printing resolution, while the total thermal isolation between mesas remains the same as in prior art mesas.

The active and passive components of the thermal display are formed in coplanar semiconductor layers 19 and 24 of opposite conductivity type which are disposed in contiguous relationship to form a PN junction. The substrate is a base layer of one conductivity type on which is grown an epitaxial layer of opposite conductivity type. The active and passive components of the display are formed in the latter layer.

As in the above referenced Vora and Wu patent, U.S. Pat. No. 3,813,513, the dual-layer substrate enables the fabrication of semiconductor heating elements in which the active components of heating circuitry are formed in one of the layers in a pattern which employs the other layer as a heating resistor in a manner substantially constraining current flow and corresponding heating within the mesa. The heating circuitry comprises a transistor formed in a discrete portion of the epitaxial layer which is electrically isolated within a layer by an annular barrier 36 and stemming from the exposed surface into the other of the layers. The construction also allows the integration of driving and character generating circuitry concurrent with the heating circuitry in a common semiconductor substrate.

Figure 2:
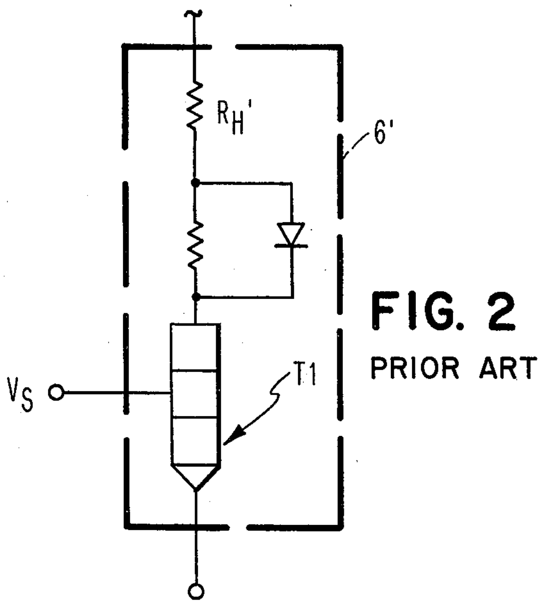
FIG. 2 PRIOR ART
FIGS. 2 and 3 are equivalent circuit representations of a conventional heating element and switch and my novel heating element and switch, respectively.
Figure 3:
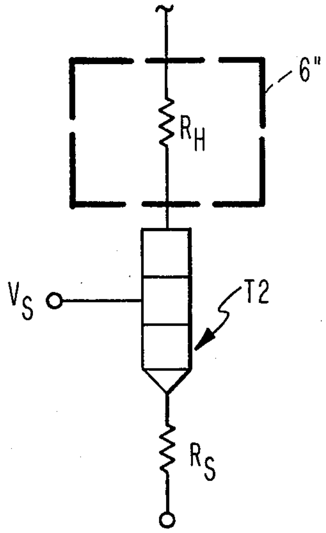
Figure 4:
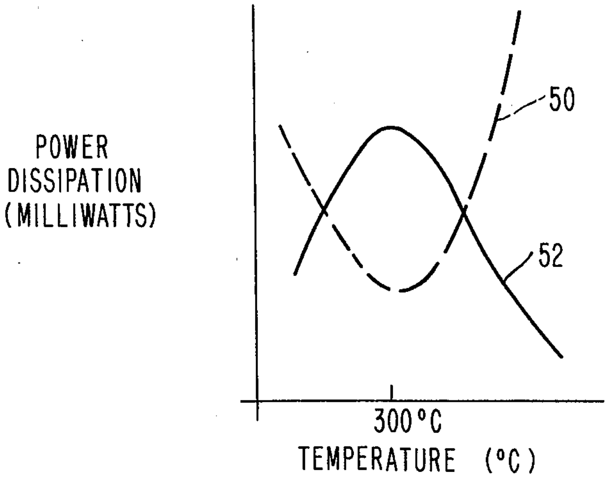
FIG. 4 shows a comparison of the power dissipation of my novel heating element versus that of a conventional heating element.

As noted previously, however, a heating device in which the switching transistor is formed in the same substrate area as the heating element itself is prone to exhibit thermal runaway. This circuit is shown in the present FIG. 2 and is adapted from FIG. 5A of U.S. Pat. No. 3,813,513. As shown in Graph 50 of FIG. 4, as the temperature of the heating substrate (mesa) increases, the power dissipation of the circuit 6' is initially lowered but then increases quickly until a runoff condition is reached. This occurs because the resistivity of the silicon heating element first increases with an increase in temperature but then decreases as the temperature further increases above around 300° C. Thus, in operation, the operating temperature of the heater must be carefully controlled so as to remain below a certain level. In practice this maximum temperature is around 300° C. Another problem is with the switching transistor T1, which breaks down at these elevated temperatures. In my inventive structure, I have removed the active transistor device which controls heating from that portion of the substrate which contains the heating element itself. In addition, as shown in FIG. 3, a resistor $R_S$ is added between the active transistor device and ground so that power dissipation in the heating element $R_H$ will be reduced as the temperature rises. Resistor $R_S$ corresponds to region 38 in FIG. 1A. The circuit shown in FIG. 3 thereby eliminates the thermal runoff problem. In FIG. 3, resistor $R_H$ is the substrate resistor of the thermally isolated silicon mesa. The transistor T2 and resistor $R_S$ are both located outside of the mesa and act as a constant current source. Resistor $R_S$ is used principally to limit the current through the heating circuit to the value $V_S/R_S$. As shown in Graph 52 of FIG. 4, the power dissipation characteristics of the circuit $R_H$ are the reverse of the heating element $R_H'$ in FIG. 2. As the temperature of the heating element increases, the power dissipation increases but then falls off as the temperature of the heater increases.

FABRICATION PROCESS

Figure 5:
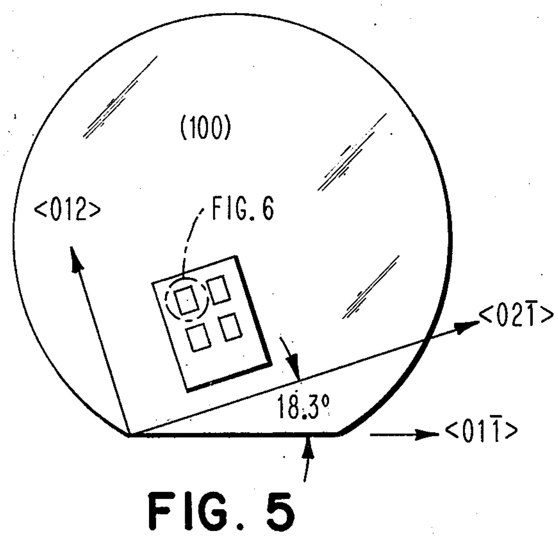
FIGS. 5 and 6 illustrate the preferred crystallographic orientation and direction of the semiconductor heater elements.
Figure 6:
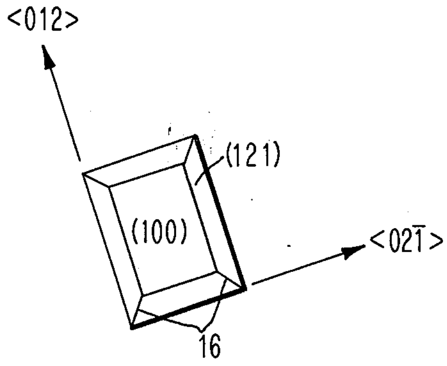

FIGS. 5, 6 and 7 illustrate a preferred process for fabricating my novel heater structure.

I prefer to begin with a thin slice of monocrystalline silicon 19 of around 8 – 20 mils in thickness and with a P-type doping with a 1 – 20 ohm-cm resistivity. The upper and lower major surfaces of the wafer slice are polished and oriented in the (100) Miller index crystallographic orientation.

The (100) oriented wafer is then oxidized in a semiconductor processing furnace having a temperature ranging between 900° C and 1200° C in an oxidizing atmosphere for a sufficient period so that a thin layer of around 5000 A silicon dioxide is formed on the slice. Those steps are quite conventional in the semiconductor art and form no part of my invention.

Using standard photolithographic techniques, the silicon dioxide is masked except in locations on the substrate where it is desired to form the trenches. The oxide is then removed by an etchant such as buffered hydrochloric acid, the photolithographic mask preventing the etchant from attacking the remainder of the silicon dioxide 18 located in areas in which it is desired not to remove the silicon.

In order to obtain a sharp corner 16 of the silicon mesa, the side of the wafer is aligned in the <012> crystallographic direction as shown in FIG. 5, so that all processing steps to join the trenches are performed in that direction.

The silicon in the exposed windows in the oxide layer is then subjected to an etching solution such as a combination of ethylenediamine, pyrocatechol and water, which etches the (100) oriented silicon but does not significantly attack the silicon dioxide layer. If a (111) oriented silicon wafer were used, which is not attacked by the above etchant, then an isotropic silicon etch, such as a conventional mixture of HF, $HNO_3$ and $CH_3COOH$ would be utilized as the etchant. The wafer remains in the etching solution until trenches approximately 4 mils deep are etched in substrate 19. The result is a mesa having the geometric configuration as shown in FIG. 6 where the side surfaces 16 defining the trenches are in the (121) crystallographic orientation.

FIGS. 7A – 7F represent certain intermediate steps used to achieve the novel structure of my invention.

Figure 7A:
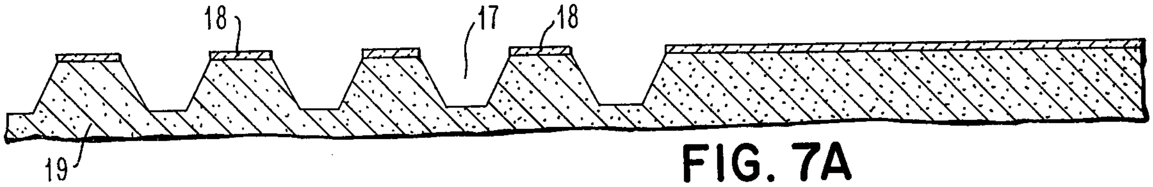
FIGS. 7A – 7F illustrate the method of fabricating the array of heating elements and associated circuitry.

FIG. 7A is a cross-sectional view of the silicon mesas which were previously illustrated in FIGS. 5 and 6. Oxide layer 18 covers the silicon substrate 19 except in those areas where trenches 17 were formed by removal of silicon. The sharp corners 16 of the mesas are the result of the process at this point.

Figure 7B:
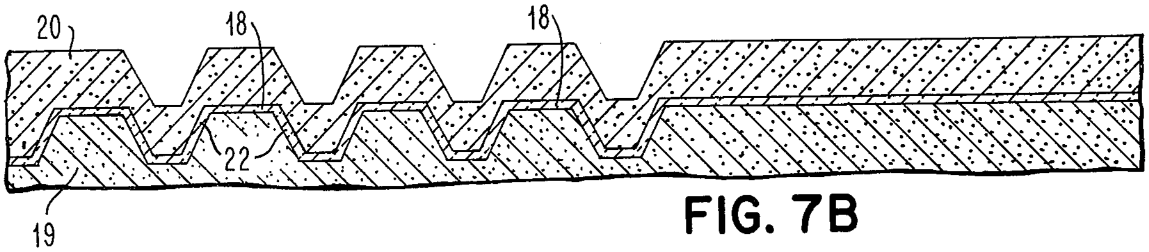

In FIG. 7B, after the trenches are formed the substrate is re-oxidized to form oxide layer 22. Polycrystalline silicon 20 is then deposited by a standard chemical vapor deposition technique to a thickness of around 4 – 5 mils on the surface of silicon slice 19. This reoxidation step is necessary to protect the (100) oriented silicon from attack by the ethylenediamine, pyrocatechol and water etchant which will be used in a later step to remove the polycrystalline silicon from the trenches. This step is unnecessary in the case of (111) silicon which is not significantly attacked in this etchant.

Figure 7C:
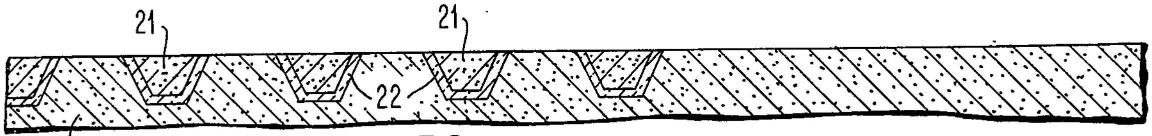

The raised portions of polycrystalline silicon 20 and oxide 18 are removed from the surface of substrate 19. The layers may be removed by mechanical lapping, using aluminum oxide or silicon carbide powder and a lapping wheel to lap the slice to a flat surface. This is followed by a chemical-mechanical polishing technique using a solution combining copper, nitric acid, ammonium fluoride and water and a mechanical polishing wheel. This latter step removes a thin layer of silicon so that a smooth, damage-free surface is obtained. The completed structure after this smoothing process is shown in FIG. 7C.

An optional step in the process is to immerse substrate 19 into a silicon etch such as the ethylenediamene-pyrocatechol-water combination previously described. The etch rate of polycrystalline silicon in this solvent is higher than that of monocrystalline (100) oriented silicon so that a small indentation in the surface of polycrystalline silicon filler 21 will result, as compared to the surface of monocrystalline layer 19. This indentation would then be used as an alignment mark for the next processing step.

Figure 7D:
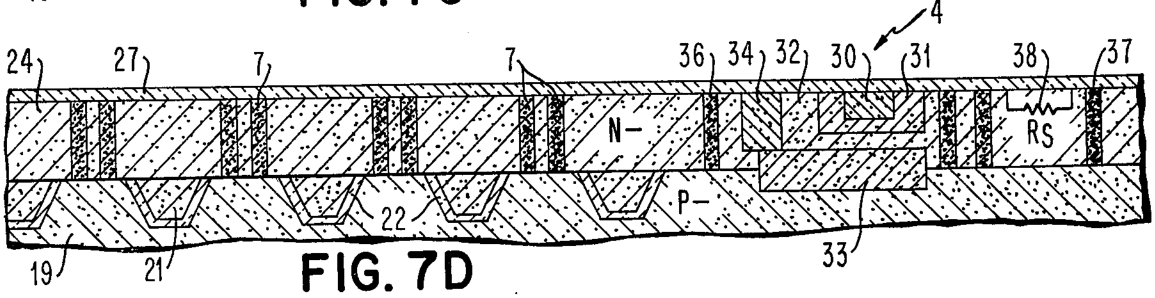
Figure 7E:
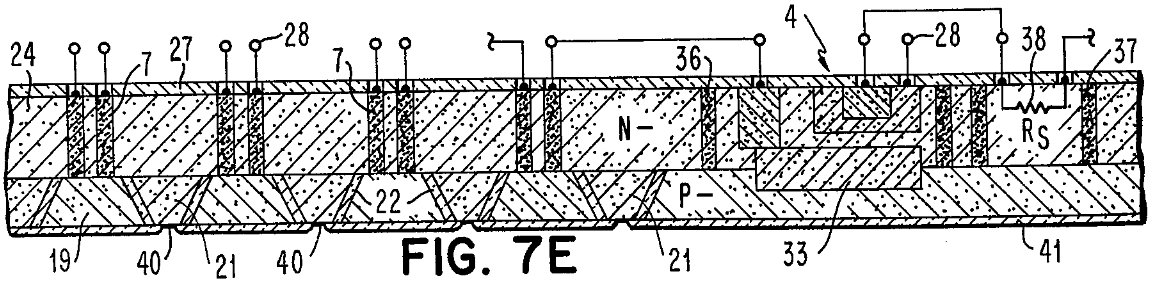

As illustrated in FIG. 7D, region 33 is then formed in layer 19 and epitaxial layer 24 is formed on the surface of substrate 19. The layer is preferably of opposite conductivity type to that of layer 19, i.e., N-type, and is about 3 – 4 microns thick. The epitaxial layer is essentially a continuation of the monocrystalline substrate 19, except in those regions above the polycrystalline areas, where epitaxial layer 19 is also polycrystalline.

Region 33 outdiffuses into epitaxial layer 24 during its deposition. Various regions are then fabricated in epitaxial layer 24 to form active devices 4, reach-through diffusions 7 and other semiconductor elements to achieve operative circuits. Transistor 4 is a conventional bipolar, integrated type comprising collector 32, subcollector 33, base 31 and emitter 30, which corresponds to T2 of FIG. 3. Region 38 is used as the resistor, $R_S$, illustrated in FIG. 3. Transistor 4 and region 38 are surrounded by isolation regions 36 and 37, respectively.

Reach-through diffusions 7 are made from the upper surface of layer 24 to those areas of substrate 19 which will become the heater mesas.

The processes used to fabricate the transistors and other regions in substrate 19 and epitaxial layer 24 are well known to those of skill in the art at the present state of the art. Such processes are described in U.S. Pat. No. 3,813,513. Of course, other processes could be used to fabricate the bipolar transistor. In addition, the present invention is in no way limited to bipolar transistors; e.g., field effect transistors could be used as well. In the next step of the process in FIG. 7E, windows are fashioned in oxide layer 27; and ohmic contacts 28 are made to the diffused regions. Suitable conductive lands, shown schematically, are formed by conventional techniques to interconnect the regions to form circuits.

In addition, the side of substrate 19 opposite epitaxial layer 24 is mechanically polished to expose the polycrystalline silicon regions 21. This step includes removing that portion of oxide layers 22 which are horizontal to the major surfaces of substrate 19. This is accomplished by the same polishing step referred to above with respect to FIG. 7C. Immersion of the wafer into the polycrystalline silicon etchant referred to previously creates small indentations in regions 21, useful as alignment marks. A thin layer 41 of silicon dioxide is then sputtered onto the polished surface of the (100) oriented substrate 19. Windows 40 are then made in oxide layer 41 over the polycrystalline regions 21 in preparation for the later step of removing regions 21. This sputtering step could be eliminated if a (111) oriented substrate had been used.

Figure 7F:
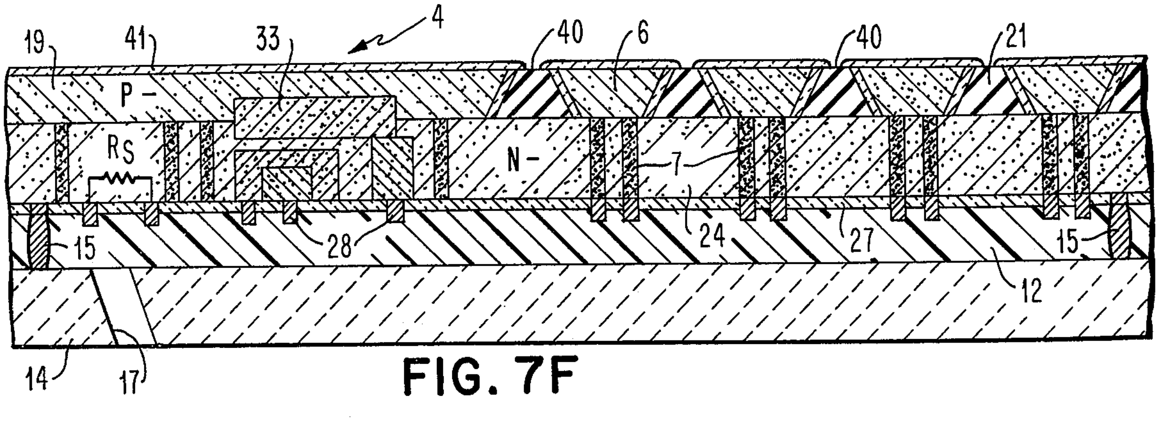

After lead-tin pads 15 are deposited by evaporation at appropriate locations on substrate 24 for interconnection, the substrate is then flipped so that substrate 19 is at the upper surface of the drawing as shown in FIG. 7F. The lead-tin pads are reflowed on to conductive lands (not shown) on ceramic substrate 14. The preferred joining technique is the controlled collapse method which has been described by L. F. Miller in U.S. Pat. No. 3,429,040. The area between semiconductor layer 24 and ceramic substrate 14 is preferably filled with an epoxy adhesive 12 to provide added support for the chip as well as insulation. The epoxy is preferably applied through a gap 17 in ceramic substrate 14.

In the next step, the entire structure is immersed in a polycrystalline silicon etchant such as the ethylenediamine mixture adverted to earlier. Because of windows 40 in the upper oxide layer 41, polycrystalline silicon filler 21 is etched away, leaving mesas 6 of the desired truncated inverted pyramid shape. The silicon dioxide regions 22 and 41 protect the monocrystalline silicon 19 from attack by the etchant. The trenches remaining after the polycrystalline silicon is etched away are then preferably filled with epoxy for thermal insulation purposes. This completes the preferred process, yielding the inventive structure shown in FIG. 1A.

While the invention has been particularly shown and described with reference to the preferred embodiments thereof, it will be understood by those skilled in the art that the foregoing and other changes in form and detail may be made therein without departing from the spirit or scope of the invention.

I claim:

1. A method for fabricating a matrix of heating mesas in a semiconductor substrate, the area of the surface of the mesas opposite said substrate being larger than the area contiguious to said substrate, comprising the steps of:

forming a matrix of trenches in a first major surface of said substrate, the bottom of said trenches having an area which is smaller than the area at the upper surface of the substrate;

filling said trenches with a material which is soluble in a solvent in which said substrate is substantially insoluble;

forming an epitaxial layer on said first major surface;

forming semiconductor circuit elements associated with said heating mesas in said epitaxial layer, removing a portion of the major surface of said substrate opposite said first major surface so as to expose said soluble material at the bottoms of said trenches; and etching said soluble material from said trenches;

whereby the semiconductor substrate regions defining said trenches are in the desired shape.

2. A method as in claim 1 further comprising the step of:

filling said trenches with a thermal isolation material after said soluble material is etched from said trenches.

3. A method as in claim 1 wherein:

said semiconductor substrate is silicon having a (111) crystallographic orientation;

said soluble material is polycrystalline silicon; and said solvent is a mixture of ethylenediamine, pyrocatechol and water.

4. A method as in claim 1 wherein said semiconductor substrate is silicon having a (100) crystallographic orientation, said soluble material is polycrystalline silicon and said solvent is a mixture of ethylenediamine, pyrocatechol and water and further comprising the step of:

forming a coating of silicon dioxide on the walls of said trenches after said trench-forming step and before said filling step;

said silicon dioxide coating serving to protect said (100) oriented silicon from attack by said dissolving mixture.

5. A method as in claim 4 wherein said trenches are formed in the <012> and <021> crystallographic directions in said substrate, whereby mesas having sharp, well-defined corners are formed.

6. A method for fabricating a matrix of heating mesas in a monocrystalline silicon substrate, the area of the surface of said mesas opposite said substrate being larger than the area contiguous to said substrate, comprising:

etching a matrix of trenches in a first major surface of said semiconductor substrate, the bottom of said trenches having a surface area which is smaller than the surface area at the upper surface of said substrate;

filling said trenches with polycrystalline silicon substantially flush with the surface of said substrate;

forming an epitaxial layer on said first major surface;

forming semiconductor circuit elements associated with said heating mesas in said epitaxial layer;

removing a portion of the major surface of said substrate opposite said first major surface so as to expose said polycrystalline silicon at the bottom of said trenches; and etching said polycrystalline silicon from said trenches, whereby the substrate material between said trenches is in the form of mesas in the desired shape.

7. A method as in claim 6 wherein said circuit element forming step is performed in a region of said epitaxial layer which is remote from said heating elements.

8. A method as in claim 6 further comprising the step of filling said trenches with a thermal insulation material after said polycrystalline silicon material has been removed therefrom.

9. A method as in claim 6 wherein:

said semiconductor substrate is silicon having a (111) crystallographic orientation;

the etching of said polycrystalline is accomplished by a mixture of ethylenediamine, pyrocatechol and water.

10. A method as in claim 6 wherein said semiconductor substrate is silicon having a (100) crystallographic orientation and further comprising the steps of:

forming a coating of silicon dioxide on the walls of said trenches after said trench-forming step;

dissolving said polycrystalline silicon in a mixture of ethylenediamine, pyrocatechol and water after the step of exposing the bottoms of said trenches, said silicon dioxide coating serving to protect said (100) oriented silicon from attack by said dissolving mixture.

11. A method as in claim 10 wherein said trenches are formed in the <012> and <021> crystallographic directions in said substrate, whereby mesas having sharp, well-defined corners are formed.

* * * * *